United States Patent
Davis, Jr. et al.

(10) Patent No.: US 9,302,277 B2
(45) Date of Patent: Apr. 5, 2016

(54) COMPONENT REWORK NOZZLE

(75) Inventors: Willie T. Davis, Jr., Raleigh, NC (US); Michk Huang, Taipei (TW); Larry G. Pymento, Cary, NC (US); Celeste Zippetelli, Raleigh, NC (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 912 days.

(21) Appl. No.: 13/539,076

(22) Filed: Jun. 29, 2012

(65) Prior Publication Data

US 2014/0001291 A1    Jan. 2, 2014

(51) Int. Cl.
| | |
|---|---|
| A62C 31/02 | (2006.01) |
| B05B 1/00 | (2006.01) |
| B23K 1/018 | (2006.01) |
| H05K 3/22 | (2006.01) |
| H05K 3/34 | (2006.01) |

(52) U.S. Cl.
CPC . B05B 1/00 (2013.01); B23K 1/018 (2013.01); H05K 3/225 (2013.01); H05K 3/3436 (2013.01); H05K 3/3494 (2013.01); H05K 2203/081 (2013.01); H05K 2203/176 (2013.01); Y10T 29/49826 (2015.01)

(58) Field of Classification Search
USPC ........................................................ 239/586
See application file for complete search history.

(56) References Cited

U.S. PATENT DOCUMENTS

| | | | | |
|---|---|---|---|---|
| 4,187,973 | A | * | 2/1980 | Fortune ................. 228/20.5 |
| 4,564,135 | A | * | 1/1986 | Barresi et al. ............. 228/6.2 |
| 4,767,047 | A | * | 8/1988 | Todd et al. ................ 228/6.2 |
| 4,787,548 | A | | 11/1988 | Abbagnaro et al. |
| 5,419,481 | A | | 5/1995 | Lasto et al. |
| 5,553,768 | A | | 9/1996 | Lasto et al. |
| 5,579,979 | A | | 12/1996 | Kurpiela |
| 5,598,965 | A | | 2/1997 | Scheu |
| 5,785,237 | A | | 7/1998 | Lasto et al. |
| 6,105,847 | A | | 8/2000 | Kim |
| 6,257,478 | B1 | | 7/2001 | Straub |
| 6,607,113 | B2 | | 8/2003 | Cilia et al. |
| 6,761,304 | B2 | * | 7/2004 | Ruszowski ............ 228/180.21 |
| 7,238,881 | B1 | * | 7/2007 | Barr et al. .................. 174/50 |
| 7,829,817 | B2 | * | 11/2010 | Zakel et al. ............. 219/121.6 |

* cited by examiner

*Primary Examiner* — Len Tran
*Assistant Examiner* — Adam J Rogers
(74) *Attorney, Agent, or Firm* — Kunzler Law Group; Damion Josephs

(57) ABSTRACT

An apparatus for a component rework nozzle includes a nozzle with a proximal end spaced apart from a distal end along an axis. The proximal end is sized to partially enclose a component during a component rework process. The component is disposed on a substrate by way of a plurality of solder joints. The apparatus includes an indentation defined in a side of the nozzle. The side of the nozzle is parallel to the axis. The indentation is shaped to maintain a separation between the nozzle and a neighboring component. The neighboring component is disposed adjacent to the component on the substrate. The apparatus includes a plurality of notches disposed on the proximal end of the nozzle. The plurality of notches are formed to balance heat distribution, during the component rework process, across the component.

20 Claims, 12 Drawing Sheets

COMPONENT REWORK NOZZLE

BACKGROUND

1. Field

The subject matter disclosed herein relates to a component rework nozzle, and particularly to a component rework nozzle that accommodates a neighboring component.

2. Description of the Related Art

In certain instances, an electrical component on a circuit board requires replacement, such as when the electrical component breaks or proves defective. In these instances, the component may be replaced by melting the solder joints holding the electrical component to the circuit board and coupling a replacement electrical component to the circuit board with new solder joints during a component rework process. During a component rework process, a nozzle is used to enclose the component and hot gas is transmitted over the component to melt the solder joints. The nozzle may shelter other components on the circuit board to prevent damage.

Circuit board manufacturers have typically complied with component-to-component spacing rules that set minimum spacing requirements between components. However, new circuit board designs sometimes force circuit board manufacturers to violate these spacing rules. As a result, traditional nozzle designs are unable to accommodate components on these circuit boards.

BRIEF SUMMARY

One embodiment of an apparatus includes a nozzle with a proximal end spaced apart from a distal end along an axis. The proximal end is sized to partially enclose a component during a component rework process. The component is disposed on a substrate by way of a plurality of solder joints. In one embodiment, the apparatus also includes an indentation defined in a side of the nozzle. The side of the nozzle is parallel to the axis. The indentation is shaped to maintain a separation between the nozzle and a neighboring component. The neighboring component is disposed adjacent to the component on the substrate. The apparatus, in one embodiment, also includes a plurality of notches disposed on the proximal end of the nozzle. The plurality of notches are formed to balance heat distribution, during the component rework process, across the component.

In one embodiment, the indentation exposes an exposed portion of the component such that the nozzle does not enclose the exposed portion of the component. In a further embodiment, the plurality of notches includes an indentation notch disposed in the indentation on the proximal end of the nozzle. The indentation notch is formed to accommodate an elevation of the exposed portion of the component. In a further embodiment, an area of an opening of the indentation notch is approximately equal to half of a total area of openings of secondary notches of the plurality of notches, the secondary notches comprising notches besides the indentation notch.

In one embodiment, one or more of a size, a shape, and a position of each notch of the plurality of notches are formed to balance the heat distribution across portions of the component above the plurality of solder joints. In one embodiment, one or more of a size, a shape, and a position of each notch of the plurality of notches are based on a position of the neighboring component in relation to the component. In one embodiment, the plurality of notches are formed to balance heat distribution across the portions of the component above the plurality of solder joints. In one embodiment, the plurality of notches are formed to balance heat distribution by minimizing a temperature difference across the portions of the component above the plurality of solder joints.

In one embodiment, the nozzle transmits hot gas in a direction along the axis toward the proximal end of the nozzle during the component rework process. In one embodiment, the nozzle includes a plurality of sides parallel to the axis and a first side and a second side join at a corner. A particular notch is disposed at the corner on the proximal end of the nozzle. In a further embodiment, the particular notch is disposed on a portion of the first side and a portion of the second side at the corner on the proximal end of the nozzle. In one embodiment, the indentation extends from the proximal end to the distal end. In one embodiment, the apparatus further includes a coupling mechanism attached to the distal end of the nozzle. The coupling mechanism is configured to couple the nozzle to a component rework station.

One embodiment of a system includes a component rework station designed to secure a substrate and to transmit hot gas through an outlet in the component rework station. In one embodiment, the system includes a coupling mechanism coupled to the component rework station and a nozzle attached to the coupling mechanism. The coupling mechanism couples the nozzle to the component rework station at the outlet. The nozzle has a proximal end spaced apart from a distal end along an axis. The proximal end is sized to partially enclose a component during a component rework process. The component is disposed on the substrate by way of a plurality of solder joints.

In one embodiment, the system includes an indentation defined in a side of the nozzle. The side of the nozzle is parallel to the axis. The indentation is shaped to maintain a separation between the nozzle and a neighboring component. The neighboring component is disposed adjacent to the component on the substrate. In one embodiment, the system includes a plurality of notches disposed on the proximal end of the nozzle. The plurality of notches are formed to balance heat distribution, during the component rework process, across the component. In one embodiment, the system further includes a positioning module in the component rework station that positions the nozzle above the component during the component rework process such that the nozzle partially encloses the component during the component rework process. In one embodiment, the system further includes a hot gas module that transmits hot gas through the nozzle in a direction along the axis toward the proximal end of the nozzle during the component rework process. The hot gas is transmitted from the outlet of the component rework station.

One embodiment of a method includes forming a nozzle. The nozzle has a proximal end spaced apart from a distal end along an axis. The proximal end is sized to partially enclose a component during a component rework process. The component is disposed on a substrate by way of a plurality of solder joints. In one embodiment, the method includes creating an indentation in a side of the nozzle. The side of the nozzle is parallel to the axis. The indentation is shaped to maintain a separation between the nozzle and a neighboring component. The neighboring component is disposed adjacent to the component on the substrate. In one embodiment, the method includes disposing a plurality of notches on the proximal end of the nozzle. The plurality of notches are formed to balance heat distribution, during the component rework process, across the component.

In one embodiment, the method includes positioning the nozzle above the component such that the nozzle partially encloses the component. In a further embodiment, the method includes transmitting hot gas through the nozzle onto the component to melt the plurality of solder joints. The hot gas is transmitted in a direction along the axis toward the proximal end of the nozzle.

Another embodiment of an apparatus includes a nozzle with a proximal end spaced apart from a distal end along an axis. The proximal end is sized to partially enclose a component during a component rework process. The component is disposed on a substrate by way of a plurality of solder joints. In one embodiment, the apparatus includes a plurality of sides parallel to the axis. The plurality of sides extend between the proximal end and the distal end. In one embodiment, the apparatus includes an indentation defined in a side of the plurality of sides. The indentation is shaped to maintain a separation between the nozzle and a neighboring component. The neighboring component is disposed adjacent to the component on the substrate. The indentation exposes an exposed portion of the component such that the nozzle does not enclose the exposed portion of the component. In one embodiment, the apparatus includes a plurality of notches disposed on the proximal end of the nozzle. The plurality of notches are formed to balance heat distribution, during the component rework process, across portions of the component above the plurality of solder joints. The plurality of notches include an indentation notch disposed in the indentation on the proximal end of the nozzle. The indentation notch is formed to accommodate an elevation of the exposed portion of the component.

Other embodiments of the invention may also be realized, and the foregoing summary is provided for convenience, and not by way of limitation.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION OF THE INVENTION

Figure 1:
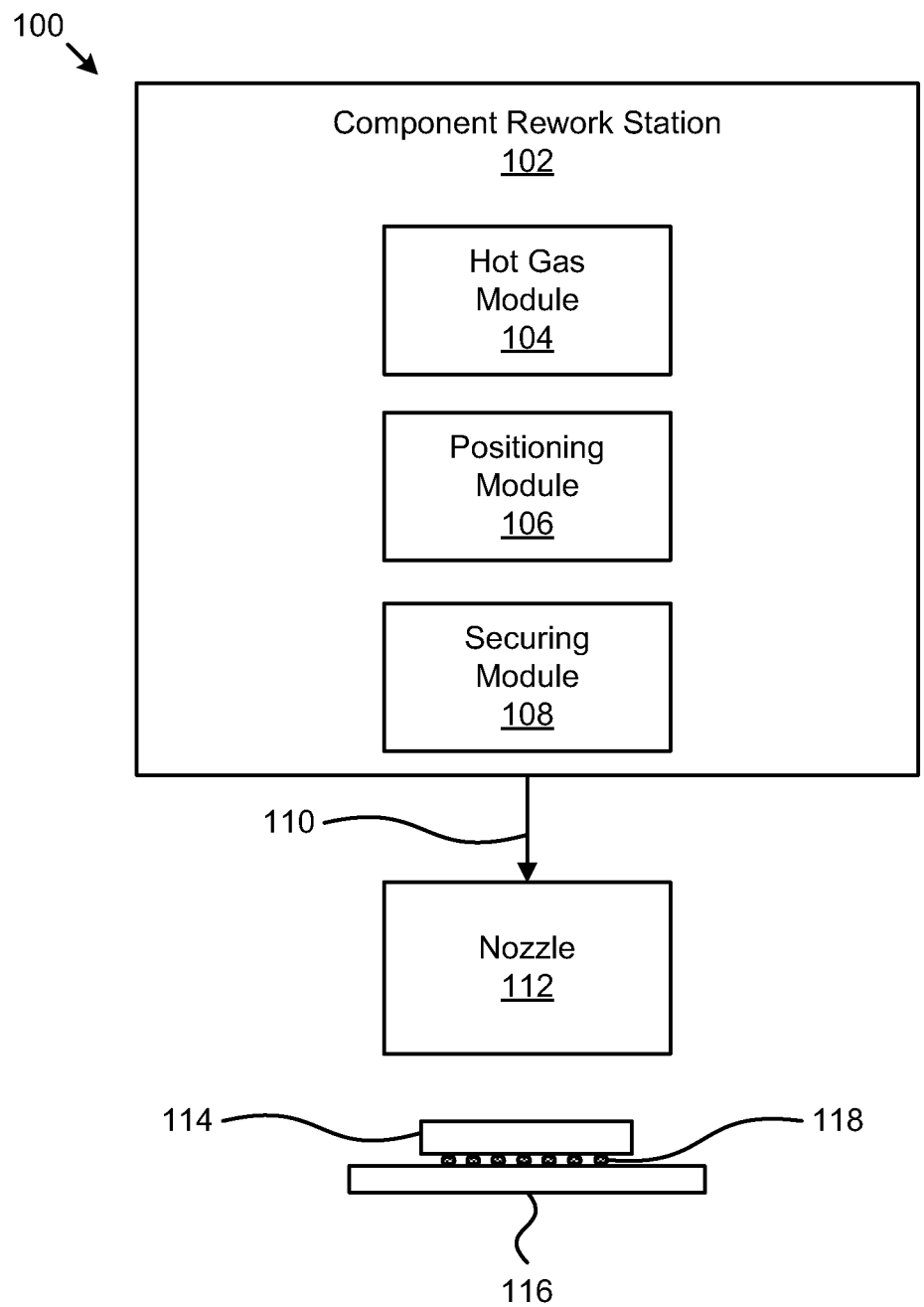
FIG. 1 is a schematic block diagram illustrating one embodiment of a system for component rework in accordance with the present invention.

References throughout this specification to features, advantages, or similar language do not imply that all of the features and advantages may be realized in any single embodiment. Rather, language referring to the features and advantages is understood to mean that a specific feature, advantage, or characteristic is included in at least one embodiment. Thus, discussion of the features and advantages, and similar language, throughout this specification may, but do not necessarily, refer to the same embodiment.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter. As will be appreciated by one skilled in the art, aspects of the present invention may be embodied as a system, method, and/or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having computer readable program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of computer readable program code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of computer readable program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the computer readable program code may be stored and/or propagated on in one or more computer readable medium(s).

The computer readable medium may be a tangible computer readable storage medium storing the computer readable program code. The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable storage medium may include but are not limited to a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store computer readable program code for use by and/or in connection with an instruction execution system, apparatus, or device.

The computer readable medium may also be a computer readable signal medium. A computer readable signal medium may include a propagated data signal with computer readable program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport computer readable program code for use by or in connection with an instruction execution system, apparatus, or device. Computer readable program code embodied on a computer readable signal medium may be transmitted using any appropriate medium, including but not limited to wireline, optical fiber, Radio Frequency (RF), or the like, or any suitable combination of the foregoing In one embodiment, the computer readable medium may comprise a combination of one or more computer readable storage mediums and one or more computer readable signal mediums. For example, computer readable program code may be both propagated as an electro-magnetic signal through a fiber optic cable for execution by a processor and stored on RAM storage device for execution by the processor.

Computer readable program code for carrying out operations for aspects of the present invention may be written in any combination of one or more programming languages, including an object oriented programming language such as Java, Smalltalk, C++, PHP or the like and conventional procedural programming languages, such as the "C" programming language or similar programming languages. The computer readable program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and computer program products according to embodiments of the invention. It will be understood that each block of the schematic flowchart diagrams and/or schematic block diagrams, and combinations of blocks in the schematic flowchart diagrams and/or schematic block diagrams, can be implemented by computer readable program code. The computer readable program code may be provided to a processor of a general purpose computer, special purpose computer, sequencer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The computer readable program code may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

The computer readable program code may also be loaded onto a computer, other programmable data processing apparatus, or other devices to cause a series of operational steps to be performed on the computer, other programmable apparatus or other devices to produce a computer implemented process such that the program code which executed on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and computer readable program code.

FIG. 1 depicts one embodiment of a system 100 for component rework. The system 100 includes a component rework station 102 that transmits hot gas through an outlet in the component rework station 102, through the nozzle 112, and over a component 114 as part of a component rework process. The component rework station 102 includes a hot gas module 104, a positioning module 106, and a securing module 108. The component rework station 102 may be releasably coupled 110 to a component rework nozzle 112 for use during the component rework process. As used herein, a component rework process refers to the process of transmitting hot gas (e.g. air) over an electrical component 114, melting solder joints 118 to either free the component 114 from a substrate 116 (when the component 114 is held in place on the substrate 116 with the solder joints 118), or attach the component 114 to the substrate 116. The component rework process may also refer to the use of the component rework nozzle 112 to transmit the hot gas over the component 114 and shield other components on the substrate 116.

In one embodiment, the component rework station 102 is designed to secure a substrate 116. The substrate 116 may include various components and provides mechanical support and electrical connections for the various components. For example, the substrate 116 may include one or more electrical connectors to connect other components and/or other substrates, one or more embedded conductors to distribute electrical power and/or communications signals, one or more insulating layers, or the like. In one embodiment, the substrate 116 comprises a printed circuit board, a ceramic substrate, a film-type substrate, or the like.

One or more components 114 may be disposed on the substrate 116. A particular component 114 is connected, coupled, mounted, and/or attached to the substrate 116 with solder joints 118. In one embodiment, the solder joints 118 comprise solder balls between contacts on the component and pads on the substrate 116 in a ball grid array or the like. A component 114 may comprise, but is not limited to, electrical components such as memory controllers, memory modules, and processors. In certain embodiments, the term component may also refer to other objects on the substrate 116 such as memory connectors, memory connector latches, or the like.

The positioning module 106, in one embodiment, positions the nozzle 112 above the component 114 during the component rework process. The positioning module 106 may include controls to position the nozzle 112 relative to the secured substrate 116. In one embodiment, the positioning module 106 is able to position the nozzle 112 relative to the component 114 in any number of positions along an X, Y, or Z axis. For example, the positioning module 106 may move the nozzle 112 or the substrate 116 with the component 114. In one embodiment, the hot gas module 104 transmits hot gas through an outlet in the component rework station 102, through the nozzle 112, and over the component 114 during the component rework process. In one embodiment, the securing module 108 secures, braces, and/or holds in position the substrate 116. The securing module 108, in certain embodiments, comprises one or more clamps, brackets, or the like, to secure the substrate 116.

Conventional component rework nozzles enclose the component 114, leaving a minimum space between ends of the nozzle and the substrate 116, between the nozzle and the component edges, and between neighboring components. The hot gas is directed down the center of the nozzle toward the center of the component 114 and is dispersed outward toward the edges of the component 114. The hot gas may disperse around the edges of the component 114 and flow out of the space between the nozzle and the substrate 116. However, some circuit board designs sometimes force circuit board manufacturers to violate minimum spacing rules between components 114 on the substrate 116. As a result, traditional nozzle designs may be unable to accommodate components 114 on these substrates 116. For example, in one embodiment, a minimum spacing requirement between components is 2 mm and an actual space between a first component and a second component may be as small as 0.2 mm.

As result, rework of a particular component 114 may require rework of additional components. For example, other components, such as memory connectors, may have to be first removed before the component rework process is performed on the particular component 114. Adding and removing components subjects the substrate 116 to additional heat cycles each time a component rework process is performed, possibly nearing or exceeding a heat cycle limit for the substrate 116.

Therefore, in one embodiment, the nozzle 112 of the system 100 is designed to accommodate a neighboring component on the substrate 116. The nozzle 112, in one embodiment, partially encloses the component 114, exposing a portion of the component 114 near the neighboring component. The nozzle 112 balances heat distribution, during the component rework process, across the component 114, including above the exposed portion of the component 114. Furthermore, the nozzle 112 also prevents excess heat on other components disposed on the substrate 116.

Figure 2:
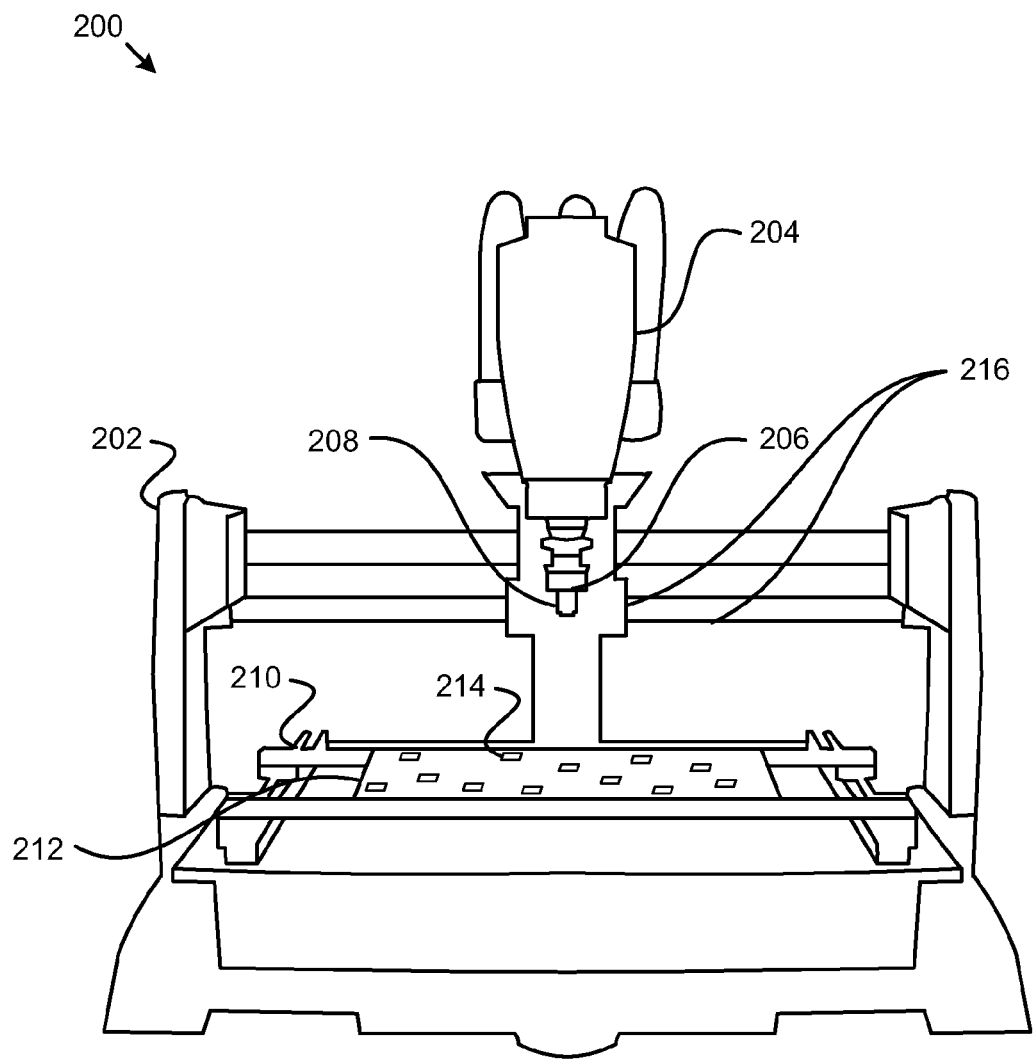
FIG. 2 is a perspective view illustrating another embodiment of a system for a component rework in accordance with the present invention.

FIG. 2 depicts another embodiment of a system 200 for a component rework. The system 200 includes a component rework station 202 coupled to a component rework nozzle 208 and securing a substrate 212. The component rework station 202 may comprise one embodiment of the component rework station 100 of FIG. 1 and may include a hot gas module 204, a positioning module 216, and a securing module 210, substantially similar to the like named modules in FIG. 1. In one embodiment, the component rework station 202 comprises the APR-3000-XLS rework station from OK International headquartered in Garden Grove, Calif., or other suitable component rework stations 202. As depicted, the securing module 210 (depicted as a clamp) secures a substrate 212 with a plurality of components 214. The nozzle 208 may be releasably coupled to the component rework station 202 at an outlet 206 of the component rework station 202 such that the hot gas module 204 may transmit hot gas through the outlet 206 and the nozzle 208 onto a component 214.

Figure 3A:
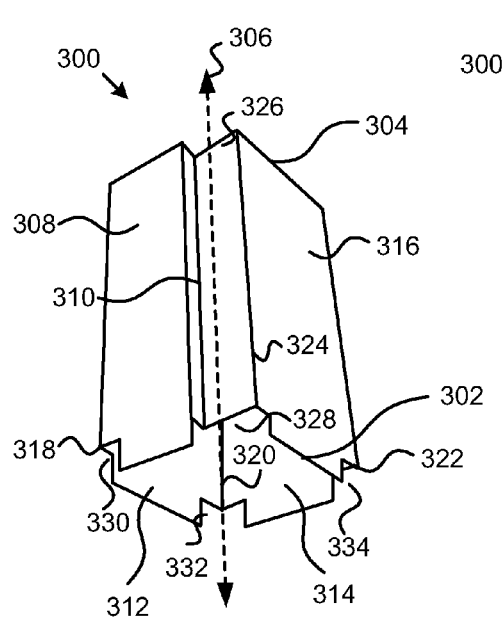
FIG. 3A is a perspective view illustrating one embodiment of an apparatus for a component rework nozzle in accordance with the present invention.

FIG. 3A depicts one embodiment of an apparatus for a component rework nozzle 300. The nozzle 300 may comprise one embodiment of the nozzle 112 depicted in FIG. 1 and/or the nozzle 208 depicted in FIG. 2. The nozzle 300 has a proximal end 302 spaced apart from a distal end 304 along an axis 306. In one embodiment, the proximal end 302 is sized to partially enclose a component during a component rework process. The nozzle 300 includes a first side 308 extending between the proximal end 302 and the distal end 304 and parallel to the axis 306. In the depicted embodiment, an indentation 310 is defined in the first side 308 of the nozzle 300. The nozzle 300 also includes a second side 312, a third side 314, and a fourth side 316 which extend between the proximal end 302 and the distal end 304. The first side 308 and the second side 312 join at a first corner 345. Likewise, the second side 312 and the third side 314, and the third side 314 and the fourth side 316, and the fourth side 316 and the first side 308, join at second, third, and fourth corners 345, 322, 324 respectively.

In the depicted embodiment, the indentation 310 comprises a recessed portion 326 of the first side 308. In one embodiment, as described below, the indentation 310 is shaped to maintain a separation between the nozzle 300 and a neighboring component. Furthermore, in the depicted embodiment, the indentation 310 extends from the proximal end 302 to the distal end 304. However, in other embodiments, the indentation 310 does not extend between the distal end 304 and the proximal end 302 as described below. The indentation 310, in the depicted embodiment, is disposed at a corner 324 of the first side 308 and the fourth side 316 (the fourth corner 324).

In the depicted embodiment, the nozzle 300 includes a plurality of notches 328, 330, 332, 334 disposed on the proximal end 302 of the nozzle 300. The plurality of notches 328, 330, 332, 334 includes an indentation notch 328. In the depicted embodiment, the indentation notch 328 is disposed in the indentation 310 on the proximal end 302 of the nozzle 300. In one embodiment, the indentation notch 328 is formed to accommodate a height of a component around which the nozzle 300 partially encloses as described below.

The plurality of notches 328, 330, 332, 334 also includes secondary notches 330, 332, 334—notches besides the indentation notch 328 used to balance a flow of gas and heat distribution along with the indentation notch 328. In the depicted embodiment, the nozzle 300 includes three secondary notches 330, 332, 334. Each secondary notch 330, 332, 334, in the depicted embodiment, is disposed at a respective corner 345, 320, 322 on the proximal end 302. Specifically, a particular secondary notch 345 is disposed on a portion of each side 308, 312 joining at the corner 345. In other embodiments, one or more secondary notches may be placed at locations other than the corners 345, 320, 322 of the apparatus 300 as described below.

Figure 3B:
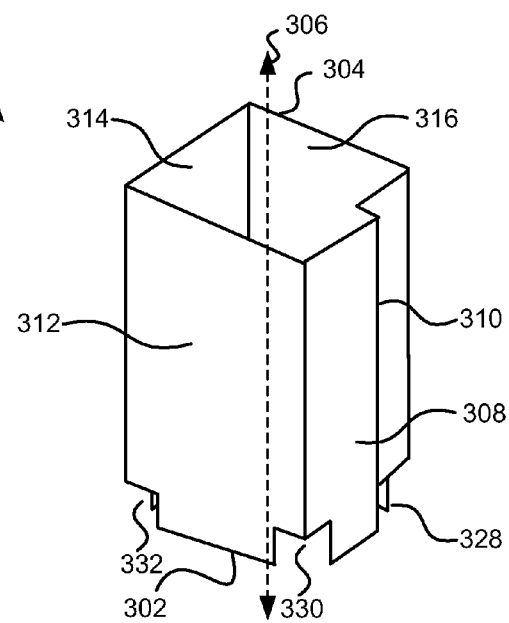
FIG. 3B is another perspective view illustrating the component rework nozzle of FIG. 3A in accordance with the present invention.

FIG. 3B is another perspective view depicting the component rework nozzle 300 of FIG. 3A. FIG. 3B depicts the plurality of sides 312, 314, 316, 308 parallel to the axis 306, the indentation 310, and several notches 328, 330, 332. The nozzle 300 may comprise a heat resistant material. In one embodiment, the nozzle 300 comprises steel or other suitable metal. In one embodiment, the nozzle 300 transmits hot gas in a direction along the axis 306 toward the proximal end 302 of the nozzle 300 during a component rework process as described below.

Figure 3C:
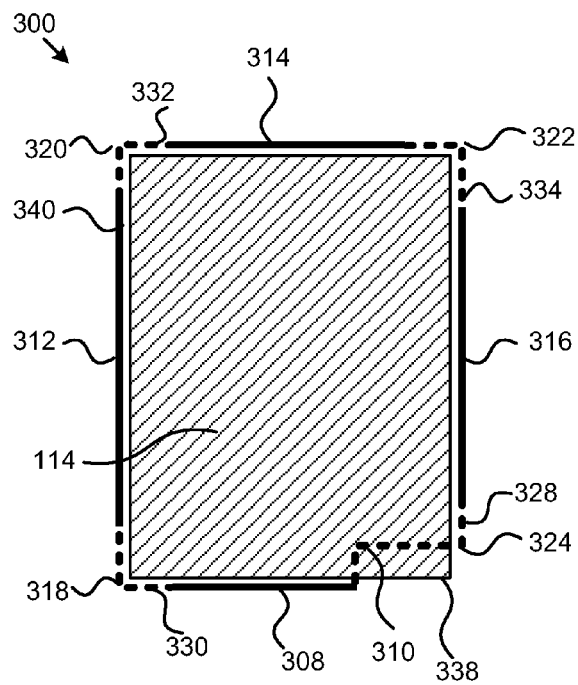
FIG. 3C is a top view illustrating the component rework nozzle of FIG. 3A in accordance with the present invention.

FIG. 3C is a top view of the component rework nozzle 300 of FIG. 3A partially enclosing a component 114. FIG. 3C depicts the first side 308 and the indentation 310 defined in the first side 308 and the fourth side 316. FIG. 3C depicts the first and second sides 308,312 joining at a corner 345, and the second and third sides 312, 314, the third and fourth sides 314, 316, and the fourth and first sides 316, 308 joining at the second, third, and fourth corners 320, 322, 324 respectively. In the depicted embodiment, the indentation 310 exposes an exposed portion 338 of the component 114 such that the nozzle 300 does not enclose the exposed portion 338 of the component 114. As described below, the exposed portion 338 may be adjacent to a neighboring component. The nozzle 300, in the depicted embodiment, is spaced apart 340 from the component 114. In one embodiment, the distance 340 between the sides of the nozzle 300 and the component 114 is approximately 0.8 mm. In one embodiment, the geometry of the nozzle 300 is based on the geometry of the component 114. For example, although the depicted nozzle 300 approximates a rectangle, the nozzle 300, in other embodiments, may approximate a square (if the nozzle 300 is shaped for a square component) or other suitable shapes. FIG. 3C depicts the indentation notch 328, and the secondary notches 330, 332, 334, disposed in corners 324, 318, 320, 322 of the nozzle 300. In the depicted embodiment, the dashed lines represent notches formed in the proximal end 302 of the nozzle 300.

The plurality of notches 328, 330, 332, 334 may be formed to balance heat distribution, during the component rework process, across a component and/or across portions of the component above solder joints. Without the indentation notch 328, solder joints below the exposed portion 338 may not reach a temperature sufficient to melt solder balls of the solder joints. In addition, the plurality of secondary notches 330, 332, 334 balance gas flow across other portions of the component. For example, in one embodiment, the corners of the component 114 may not receive sufficient heat to melt solder joints 118 underneath the corners when hot gas escapes through the indentation notch 328. Therefore, the secondary notches 330, 332, 334 may be disposed on the corners 345, 320, 322, 324 of the nozzle 112 as depicted, to balance heat and a flow of gas across the component 114 and provide sufficient heat to melt solder joints 118 underneath the corners of the component 114.

In one embodiment, one or more of a size, a shape, and a position of each notch of the plurality of notches 328, 330, 332, 334 are formed to balance the heat distribution across the entire component 114. In another embodiment, one or more of a size, a shape, and a position of each notch of the plurality of notches 328, 330, 332, 334 are formed to balance the heat distribution portions of the component 114 above a plurality of solder joints 118 attaching the component 114 to the substrate 116. In this embodiment, a temperature difference across portions of the component 114 not above the solder joints 118 may be higher than those portions of the component 114 above the solder joints 118. Balancing heat distribution may refer to minimizing a temperature difference across the portions of the component 114 above the plurality of solder joints 118. For example, in one embodiment, the component 114 is disposed on the substrate 116 with solder joints 118 around an outside of the component. The size, shape, and/or position of the plurality of notches 328, 330, 332, 334 may be formed to balance heat distribution across the outside portions of the component 114 (e.g. above the solder joints 118).

Figure 3D:
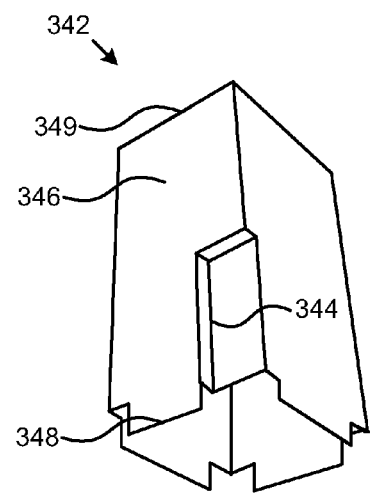
FIG. 3D is a perspective view illustrating another embodiment of a component rework nozzle in accordance with the present invention.

FIG. 3D is a perspective view illustrating yet another embodiment of a component rework nozzle 342. In the nozzle 342 of FIG. 3D, the indentation 344 does not extend an entire length between the distal end 349 and the proximal end 348. Instead, the indentation 344 extends along a first side 346 a portion of the length between the distal end 349 and the proximal end 348. In certain embodiments, the indentation 344 extends a length sufficient to accommodate a height of a neighboring component.

Figure 3E:
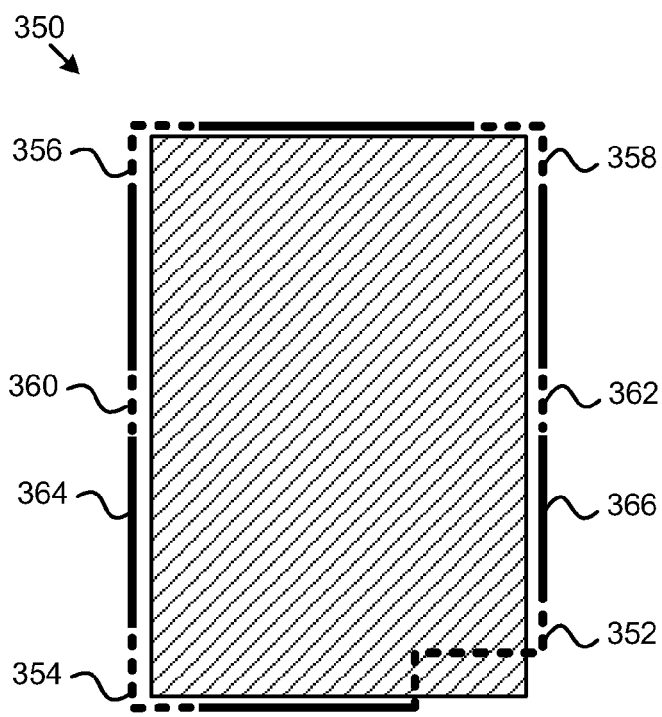
FIG. 3E is a top view illustrating yet another embodiment of a component rework nozzle in accordance with the present invention.
Figure 3F:
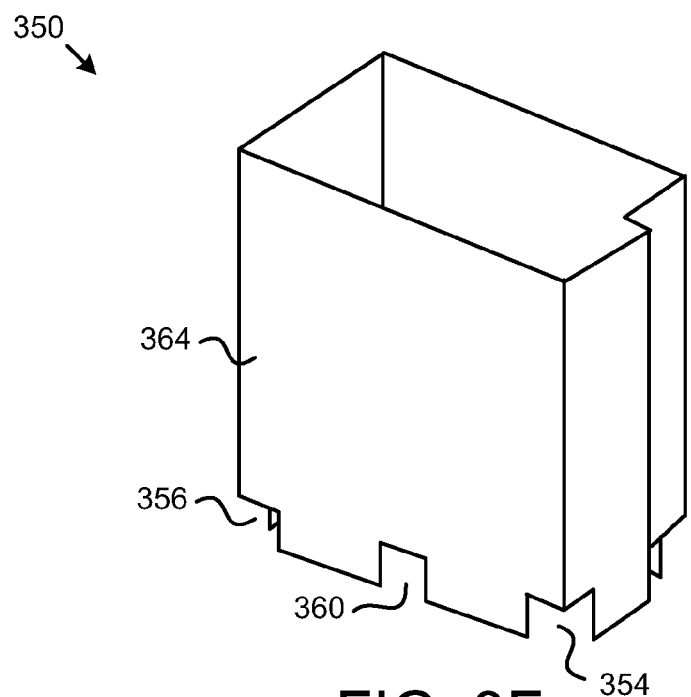
FIG. 3F is a perspective view illustrating the component rework nozzle of FIG. 3E in accordance with the present invention.

FIG. 3E depicts yet another embodiment of a component rework nozzle 350. As described above, in certain embodiments, one or more secondary notches 360, 362 may be placed at locations other than the corners of the nozzle 350. The depicted embodiment includes an indentation notch 352 and secondary notches 354, 356, 358 disposed in the corners of the nozzle 350. In addition, the nozzle 350 includes a first secondary notch 360 along a first side 364 of the nozzle 350 and a second secondary notch 362 along a second side 366 of the nozzle 350. FIG. 3F is a perspective view illustrating the nozzle 350 of FIG. 3E, depicting secondary notches 354, 356 disposed in the corners of the nozzle 350 and a secondary notch 360 disposed in the first side 364 of the nozzle 350.

Figure 4A:
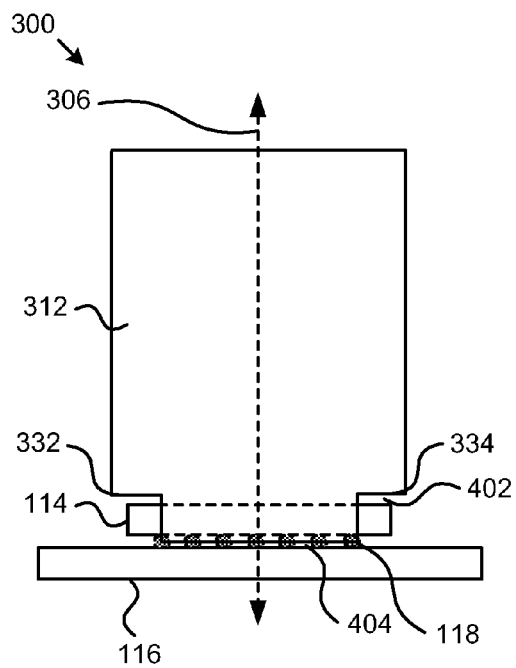
FIG. 4A is a side view illustrating one embodiment of an apparatus for a component rework nozzle in accordance with the present invention.

FIG. 4A is a side view depicting one embodiment of an apparatus for a component rework nozzle 300. The nozzle 300, in one embodiment, is substantially similar to the nozzle 300 depicted in FIGS. 3A-D. FIG. 4A depicts a side 312 of the nozzle 300 lacking an indentation. The side 312 may be substantially similar to the second side 312 or the third side 314 of the nozzle 300 in FIGS. 3A-D. The side 312 is parallel to an axis 306 and includes portions of a first secondary notch 332 and a second secondary notch 334 on a proximal end 302 of the nozzle 300. In the depicted embodiment, the proximal end 302 partially encloses a component 114 that is disposed on a substrate 116. As described above, the component 114 may comprise an electrical component such as a memory controller, memory module, processor, or the like.

The component 114 is disposed on the substrate 116 by being connected, coupled, mounted, and/or attached to the substrate 116 with solder joints 118 comprising solder balls between contacts on the component 114 and pads on the substrate 116 in a ball grid array or the like. In one embodiment, the component 114 is disposed on the substrate 116 using Mixed Solder Assembly (MSA)—tin-lead solder paste and lead-free solder balls—or other suitable soldering processes.

Each secondary notch 332, 334 accommodates an elevation of the component 114 and provides an opening 402, above the component 114, for hot gas to flow out of the nozzle 300. In addition, in the depicted embodiment, the proximal end 302 is positioned (e.g. by the positioning module 106) above the substrate 116, during the component rework process, leaving a gap 404 between the nozzle 300 and the substrate 116 for hot gas escape during the component rework process as described below.

Figure 4B:
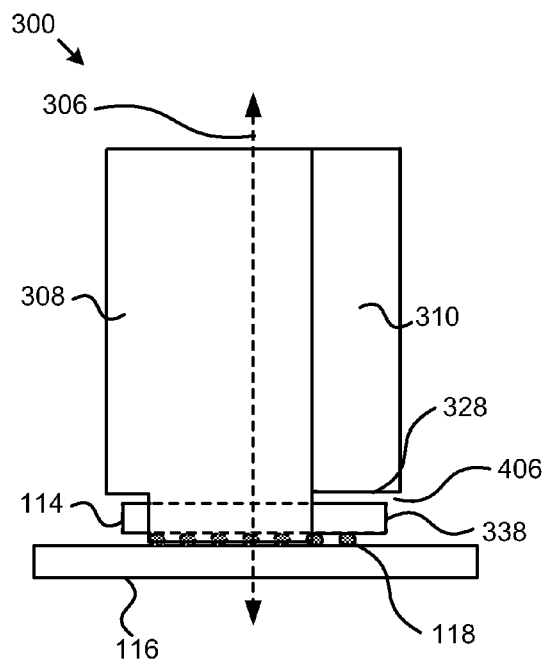
FIG. 4B is a another side view illustrating the component rework nozzle of FIG. 4A in accordance with the present invention.

FIG. 4B depicts another side view illustrating the component rework nozzle 300 of FIG. 4A. FIG. 4B depicts a side 308 of the nozzle 300, parallel to the axis 306, having the indentation 310 exposing an exposed portion 338 of the component 114. Likewise the side 308 includes the indentation notch 328. The side 308 may be substantially similar to the first side 308 depicted in FIGS. 3A-D. In the depicted embodiment, the indentation notch 328 is formed to accommodate an elevation of the exposed portion 338. In the depicted embodiment, the indentation notch 328 also provides an opening 406, above the component 114, for hot gas to flow out of the nozzle 300 through the indentation notch 328. As described below, the hot gas flowing out of the indentation notch 328 over the exposed portion 338 may provide the solder joints 118 below the exposed portion 338 with sufficient heat to melt the solder balls during the component rework process even though the exposed portion 338 is not enclosed by the nozzle 300.

Figure 4C:
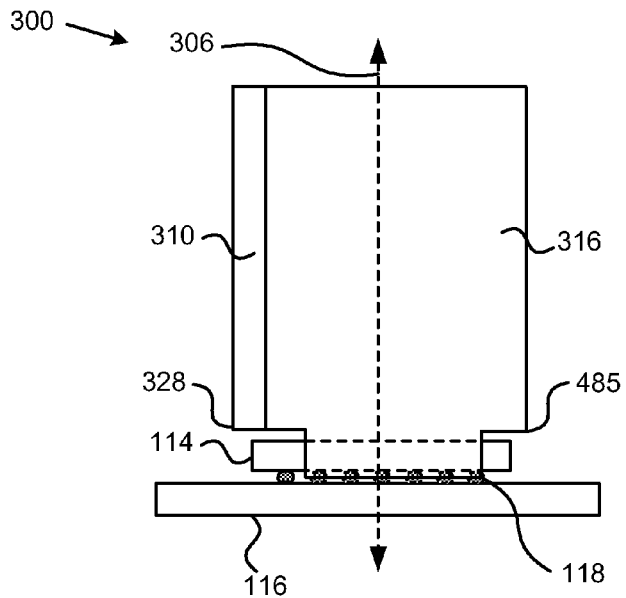
FIG. 4C is yet another side view illustrating the component rework nozzle of FIG. 4A in accordance with the present invention.

FIG. 4C depicts another side view of the component rework nozzle 300 of FIG. 4A. FIG. 4C depicts a side 316 of the nozzle 300, parallel to the axis 306 and a portion of the indentation 308 and the indentation notch 328. The side 316 may be substantially similar to the fourth side 316 depicted in FIGS. 3A-D. In addition, the side 334 also includes a secondary notch 334 that may be substantially similar to the third secondary notch 334 of FIGS. 3A-D.

Figure 5A:
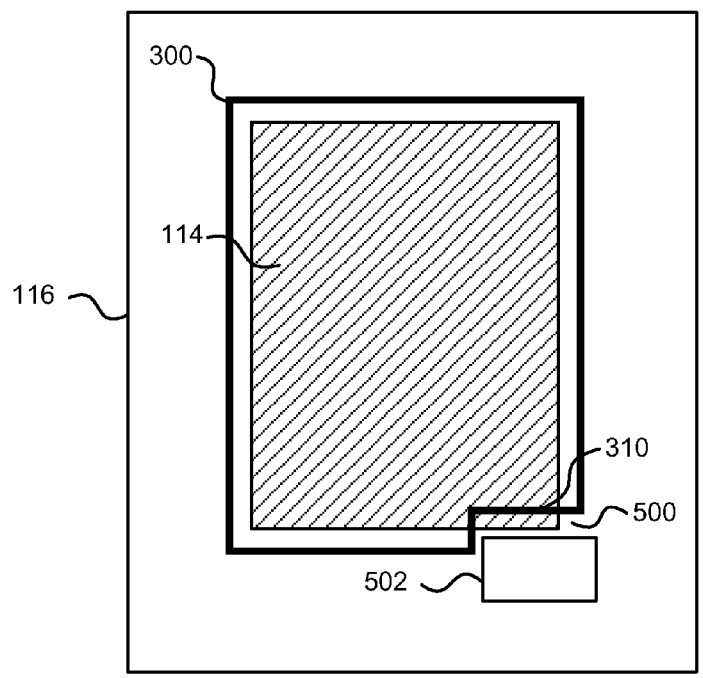
FIG. 5A is a top view illustrating one embodiment of an apparatus for a component rework nozzle accommodating a neighboring component in accordance with the present invention.

FIG. 5A is a top view depicting one embodiment of an apparatus for a component rework nozzle accommodating a neighboring component. In the depicted embodiment, the nozzle 300, which includes an indentation 310, partially encloses a component 114 on a substrate 116. Furthermore, the nozzle 300, the indentation 310, the component 114 and the substrate 116 may be substantially similar to the like named elements of FIGS. 3A-D and FIGS. 4A-C respectively. In the depicted embodiment, a neighboring component 502 is disposed on the substrate 116 adjacent to the component 114. As depicted, the indentation 310 in the nozzle 300 is shaped to maintain a separation 500 between the nozzle 300 and the neighboring component 502.

The neighboring component 502 may comprise an electrical component such as a memory controller, a memory module, or a processor. In one embodiment, the neighboring component 502 comprises other objects on the substrate 116 such as a memory connector—e.g. a dual in-line memory module DIMM connector—a memory connector latch, or the like. In one embodiment, the separation 500 is sized to prevent the neighboring component 502 from receiving heat damage from the nozzle 300 during the component rework process. In one embodiment, the separation 500 is approximately 2 mm.

Figure 5B:
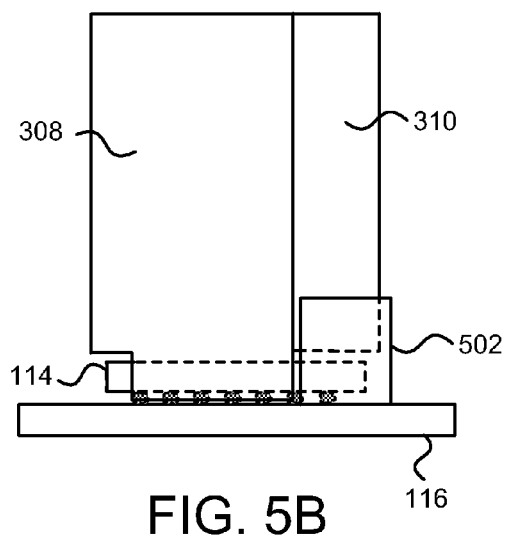
FIG. 5B is a side view illustrating one embodiment of the component rework nozzle accommodating the neighboring component of FIG. 5A in accordance with the present invention.
Figure 5C:
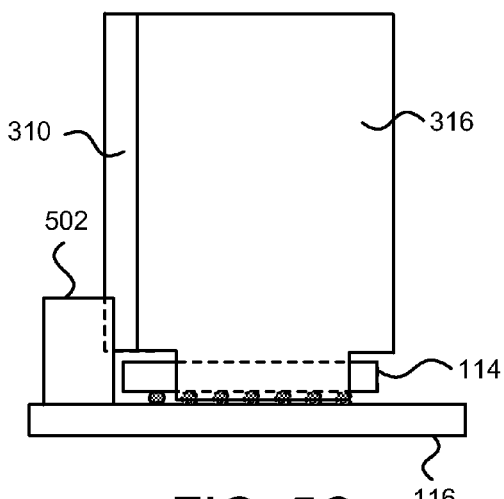
FIG. 5C is a another side view illustrating one embodiment of the component rework nozzle accommodating the neighboring component of FIG. 5A in accordance with the present invention.

FIG. 5B is a side view illustrating the nozzle 300 of FIG. 5B accommodating the neighboring component 502. In the depicted embodiment, a side 308 of the nozzle 300 partially encloses the component 114 on the substrate 116. The side 308 may be substantially similar to the first side 308 of FIGS. 3A-D, having the defined indentation 310. As depicted, the indentation 310 may accommodate the neighboring component 502 on the substrate 116. Likewise, FIG. 5C is another side view illustrating the nozzle 300 of FIG. 5A accommodating the neighboring component 502. FIG. 5C depicts a side 316 of the nozzle 300 that may be substantially similar to the fourth side 316 of FIGS. 3A-D.

Figure 5D:
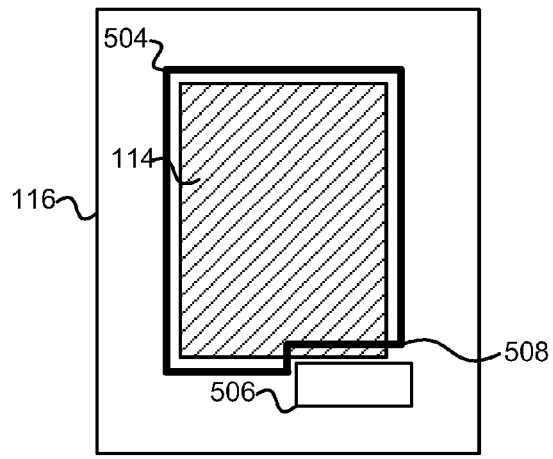
FIG. 5D is a top view illustrating a second embodiment of an apparatus for a component rework nozzle accommodating a neighboring component in accordance with the present invention.
Figure 5E:
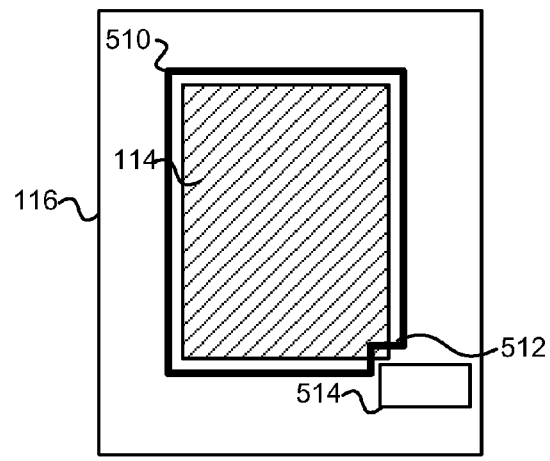
FIG. 5E is a top view illustrating a third embodiment of a component rework nozzle accommodating a neighboring component in accordance with the present invention.
Figure 5F:
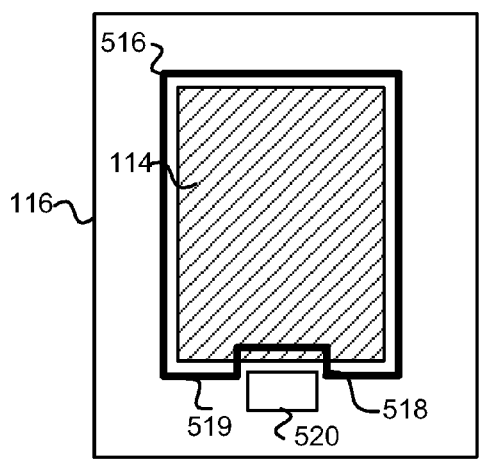
FIG. 5F is a top side view illustrating a fourth embodiment of a component rework nozzle accommodating a neighboring component in accordance with the present invention.

FIGS. 5D-5F depict various embodiments of the nozzle accommodating neighboring components of various shapes and positions relative to the component 114. Specifically, FIGS. 5D and 5E depict nozzles 504, 510 accommodating neighboring components 506, 514 of various shapes disposed in various positions on the substrate 116. In these embodiments, the indentation 508, 512 may be shaped to accommodate the size and shape of the neighboring component 506, 514. FIG. 5F depicts one embodiment of a neighboring component 520 being disposed along a center portion of the component 114 (e.g. not near a corner of the component 114). As depicted, the indentation 518 may be formed in a first side 519 of the nozzle 516 to accommodate the size, shape, and position of this neighboring component 520.

Figure 6A:
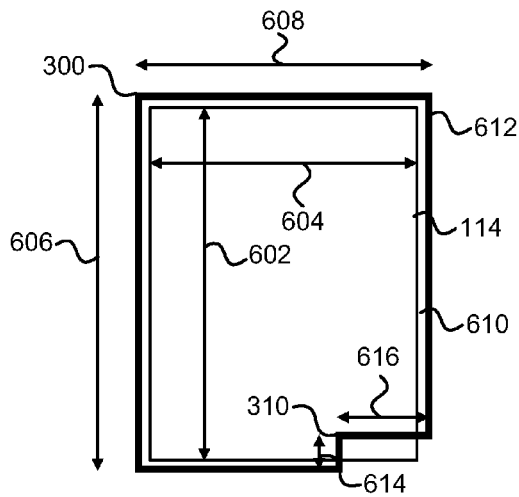
FIG. 6A is a top view illustrating one embodiment of measurements of a component rework nozzle in accordance with the present invention.

FIG. 6A depicts one embodiment of measurements of a component rework nozzle 300 and a component 114 partially enclosed by the nozzle 300. In one embodiment, the nozzle 300 and component 114 are substantially similar to the component 114 and nozzle 300 of FIGS. 3A-D. In one embodiment, the dimensions of the nozzle 300 and/or the indentation 310 are based on dimensions of the component 114, the neighboring component, and/or the distance between the component and the neighboring component. For example, in one embodiment, the nozzle 300 is shaped such that the nozzle 300 maintains a space 610 between the sides 612 of the nozzle 300 and the component 114 of approximately 8 mm.

Figure 6B:
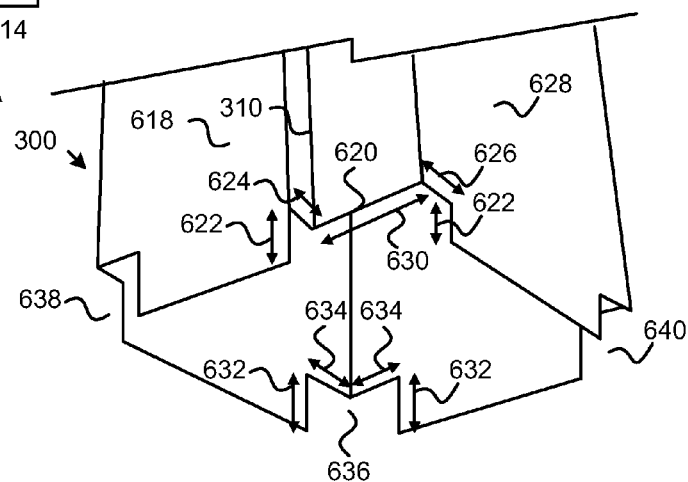
FIG. 6B is a perspective view illustrating one embodiment of notch measurements of a component rework nozzle in accordance with the present invention.

For a component 114 with dimensions with a length 602 of approximately 25 mm and a width 604 of approximately 21 mm, the nozzle 300 may have a length 606 of approximately 27.1 mm and a width 608 of approximately 23.1 mm. In one embodiment, a distance 610 between the sides 612 of the nozzle 300 and the component 114 is approximately 0.8 mm. In one embodiment, a thickness of the sides of the nozzle 300 is approximately 0.25 mm. Furthermore, in one embodiment, a depth 614 of the indentation is approximately 3 mm and a width 616 of the indentation is approximately 8 mm. The preceding measurements comprise a non-limiting, example embodiment FIG. 6B depicts one embodiment of notch measurements of a component rework nozzle 300. In one embodiment, the notch measurements are for a nozzle 300 and component having the measurements described in relation to FIG. 6A. A height 622 of the indentation notch 620, in one embodiment, is approximately 4 mm. In one embodiment, a depth 624 of the indentation notch 620 is approximately 3 mm and a width 630 of the indentation notch 620 is approximately 8 mm. A width 626 of the indentation notch 620 disposed on a side 628 that joins at a corner the side 618 defining the indentation may be 4 mm. Furthermore, in one embodiment, a height 630 of one or more secondary notches 636 is approximately 4 mm. In one embodiment, a width 634 of a portion of the secondary notch 636, on each side comprising the secondary notch 636, is approximately 4 mm.

In one embodiment, an area of an opening of the indentation notch 620 is greater than an area of opening of other notches 636. In one embodiment, measurements and/or an area of opening of each secondary notch 636 is approximately equal to measurements and/or an area of opening of each other secondary notch 638, 640. In one example embodiment, an area of an opening of the indentation notch 620 equals 44 mm$^2$ and a total area of openings of secondary notches 636, 638, 640 equals 96 mm$^2$ (e.g. each secondary notch equals 32 mm$^2$). In one embodiment, an area of an opening of the indentation notch 620 is approximately equal to half of a total area of openings of secondary notches 636, 638, 640 of the plurality of notches. In another embodiment, the area of an opening of the indentation notch 620 is approximately equal to the total area of openings of secondary notches 636, 638, 640 of the plurality of notches. In some embodiments, a relationship between the area of opening of the indentation notch and the total area of openings of the secondary notches 636, 638, 640 depends on a size of the component, placement of solder joints beneath the component, a size and/or position of the neighboring component, and/or the like. In one embodiment, one or more of a size, a shape, and a position of each notch of the plurality of notches 620, 636, 638, 640 are based on a geometry and/or a position of the neighboring component in relation to a component in which the nozzle 300 is designed to partially enclose. Specifically, in one embodiment, the indentation 310 is shaped to accommodate the neighboring component. The indentation notch 620, in one embodiment, depends on the size of the indentation 310 and the greater the area of opening of the indentation notch 620, the greater the area of opening of the secondary notches 636, 638, 640.

Figure 6C:
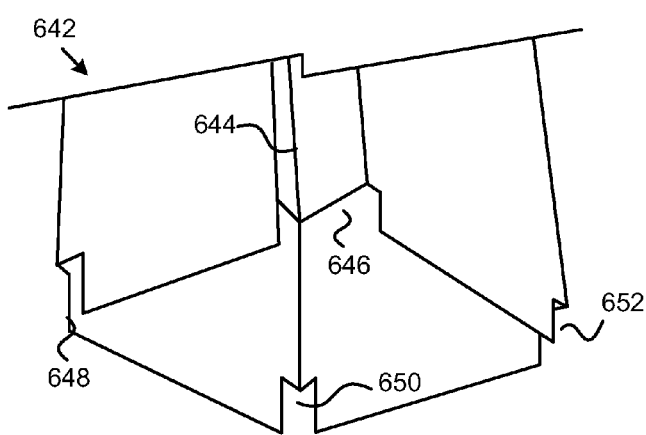
FIG. 6C is a perspective view illustrating another embodiment of notches of a component rework nozzle in accordance with the present invention.

FIG. 6C is a perspective view illustrating another embodiment of notches of a component rework nozzle 642. As stated above, an area of an opening of the indentation notch 646 is approximately equal to a half of a total area of openings of secondary notches 648, 650, 652 of the plurality of notches. Therefore, in the depicted embodiment, an area of opening of the indentation notch 646 is smaller in comparison with an area of opening of the indentation notch 620 of the nozzle in FIG. 6B. As a result, in the depicted embodiment, the area of openings of the secondary notches 648, 650, 652 are also smaller to balance hot gas flow with the indentation notch 646.

Figure 7A:
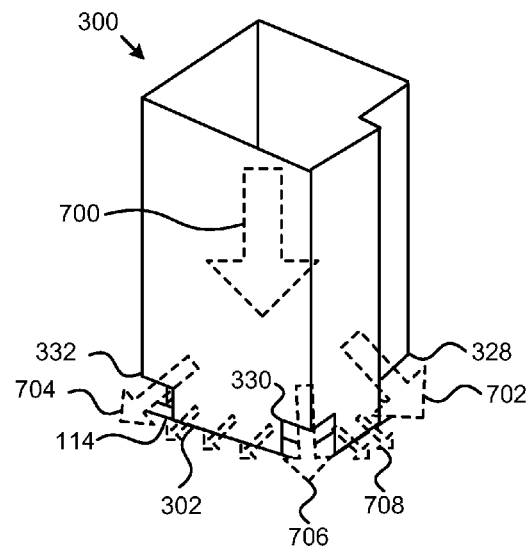
FIG. 7A is a perspective view illustrating one embodiment of a flow of gas through a component rework nozzle in accordance with the present invention.

FIG. 7A is a perspective view illustrating one embodiment of a flow of gas through a component rework nozzle 300 partially enclosing a component 114. In one embodiment, the nozzle 300 and component 114 are substantially similar to the component and nozzle 300 of FIGS. 3A-D. FIG. 7A depicts hot gas 700 being transmitted in a direction toward the distal end 302 of the nozzle 300, over the component 114, and through 704, 706, 702 the plurality of notches 332, 330, 334 and the gap 710 under the sides of the nozzle 300.

As described above, in one embodiment, the plurality of notches 332, 330, 334 is formed to balance heat distribution, during the component rework process, across the component. Specifically, in one embodiment the plurality of notches 332, 330, 334 is formed to balance heat distribution across the portions of the component above the plurality of solder joints during the component rework process. The plurality of notches 332, 330, 334 may balance heat distribution by minimizing a temperature difference across the portions of the component above the plurality of solder joints. In addition, in one embodiment, one or more of a size, a shape, and a position of each notch of the plurality of notches 332, 330, 334 are formed to balance the heat distribution across portions of the component 114 above the plurality of solder joints.

Figure 7B:
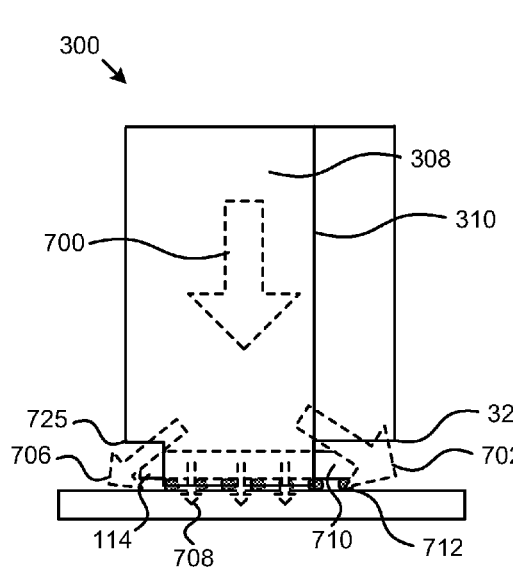
FIG. 7B is a side view illustrating a flow of gas through the component rework nozzle of FIG. 7A in accordance with the present invention.

Specifically, referring to FIG. 7B, depicting a side 308 of the nozzle 300 with the indentation 310, the indentation notch 334 may increase a flow of gas 702 over the exposed portion 710 of the component 114, allowing for solder joints 712 under the exposed portion 710 to reach a temperature sufficient to melt solder balls of the solder joints 712. The secondary notches 332, 330 may likewise provide for gas flow 704, 706 out of the nozzle 300 to balance heat distribution across the remainder of the component 710 and/or other portions of the component 710 over solder joints to at least partially compensate for the increased flow of gas over the exposed portion 710 out of the indentation notch 334.

Figure 7C:
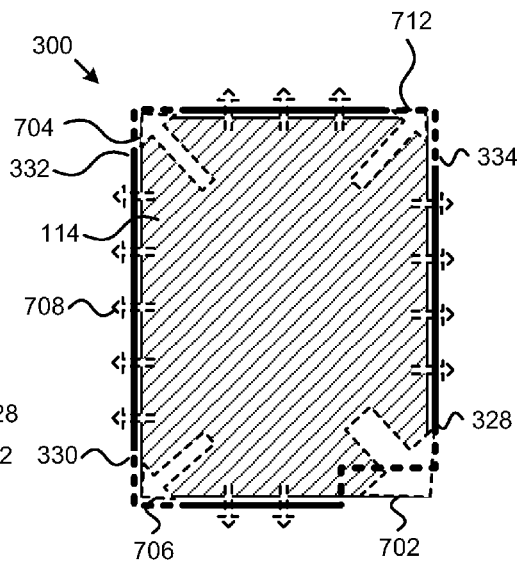
FIG. 7C is a top view illustrating a flow of gas through the component rework nozzle of FIG. 7A in accordance with the present invention.

FIG. 7C depicts a top view of the nozzle 300, the component, and gas flow 706, 704, 702, 712 over the component 114 through the plurality of notches 330, 332, 334, 328, as well as a flow of gas 708 between the nozzle and the substrate. As depicted, the indentation notch 334 provides an increased amount of a flow of gas 702 over the exposed portion of the component 114. In one embodiment, the secondary notches 330, 332, 334 balance heat distribution over the component 114 and/or portions of the component 114 over solder joints by directing a portion of the gas flow away from the indentation notch 328 to the corners. In one embodiment, with only an indentation notch 328, the corners of the component 114 may not reach a sufficient temperature to melt solder balls of solder joints underneath the corners. Therefore, the secondary notches 330, 332, 334 serve to balance heat distribution to melt solder balls underneath the corners. In one embodiment, the size, shape, and/or position of the plurality of notches 330, 332, 334, 328 are formed to avoid excess heat exposure of other components on the substrate (e.g. components besides the neighboring component and the component 114).

Figure 8:
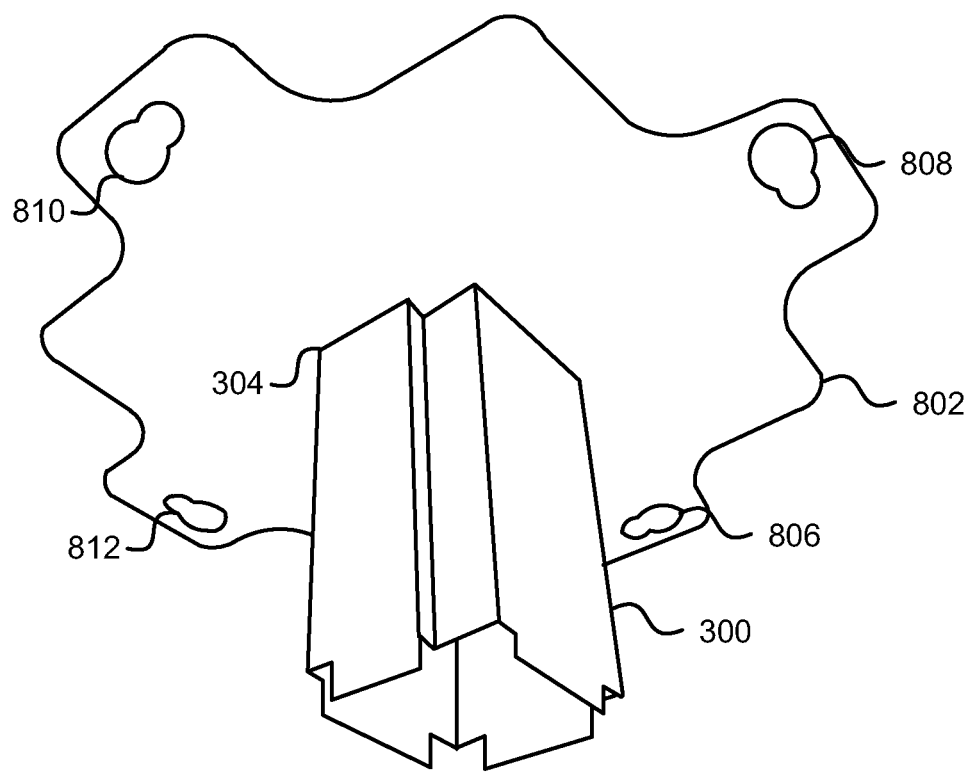
FIG. 8 is a perspective view illustrating one embodiment of an apparatus for a component rework nozzle attached to a coupling mechanism in accordance with the present invention.

FIG. 8 depicts a component rework nozzle 300 attached to a coupling mechanism 802. The nozzle 300 may be substantially similar to the nozzle 300 of FIGS. 3A-D. In the depicted embodiment, the nozzle 300 is attached to the coupling mechanism 802 on the distal end 304 of the nozzle 300. The coupling mechanism 802 is formed to couple the nozzle 300 to a component rework station 100, 202 such as that described above in relation to FIGS. 1 and 2. The coupling mechanism 802 may couple the nozzle 300 at an outlet of the component rework station 100, 202 such that hot gas is transmitted through the outlet and subsequently through the nozzle 300. The coupling mechanism 802, in the depicted embodiment, includes a plurality of openings 806, 808, 810, 812 formed to engage with pins on the component rework station 100, 202. In other embodiments, the coupling mechanism 802 couples the nozzle 300 to the component rework station 100, 202 using other suitable mechanisms.

Figure 9:
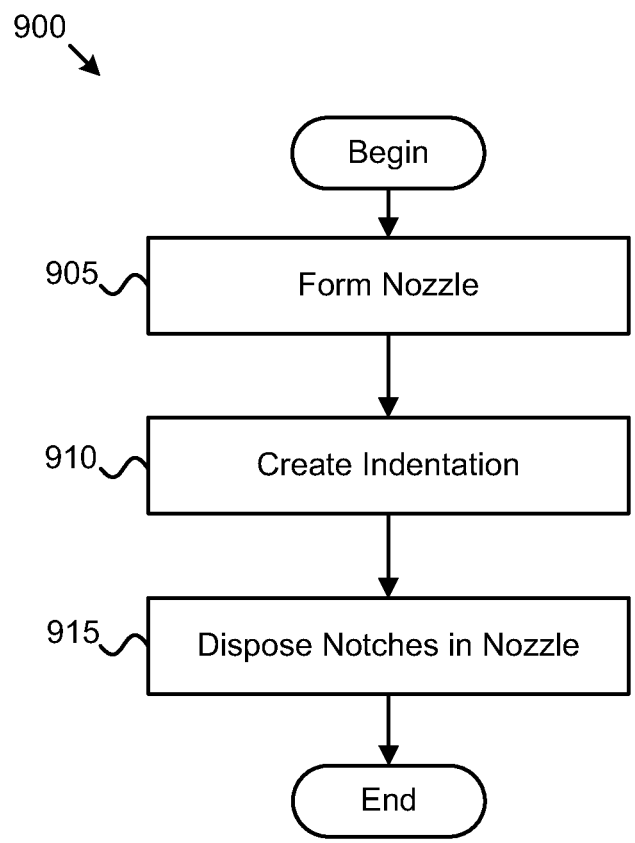
FIG. 9 is a schematic flow chart diagram illustrating one embodiment of a method for a component rework nozzle in accordance with the present invention.

FIG. 9 is a schematic flow chart diagram illustrating one embodiment of a method 900 for a component rework nozzle 300. The method 900 refers to elements of FIGS. 1, 2, and 3A-D. The method 900 begins and forms 905 a nozzle 300. In one embodiment, an assembler forms the nozzle 300. The assembler may include an assembly worker, an automated mechanical and/or electrical process, a combination of an assembly worker and an automated process, an operator, or the like. The nozzle 300 may have a proximal end 302 spaced apart from a distal end 304 along an axis 306. The proximal end 302 may be sized to partially enclose a component 114 during a component rework process. The component 114 may be disposed on a substrate by way of a plurality of solder joints.

The method 900 creates 910 an indentation 310 in a side 308 of the nozzle 300. In one embodiment, the assembler creates the indentation 310. The side 308 of the nozzle 300 may be parallel to the axis 306. The indentation 310 may be shaped to maintain a separation between the nozzle 300 and a neighboring component. The neighboring component may be disposed adjacent to the component on the substrate.

The method 900 disposes 915 a plurality of notches 328, 330, 332, 334 on the proximal end 302 of the nozzle 300. For example, the assembler may dispose the plurality of notches 328, 330, 332, 334 on the proximal end 302 of the nozzle 300. The plurality of notches 328, 330, 332, 334 may be formed to balance heat distribution, during the component rework process, across the component. Then, the method 900 ends. In other embodiments, the method 900 may include positioning the nozzle 300 above the component such that the nozzle 300 partially encloses the component. For example, the positioning module 106 may position the nozzle 300 above the component 114. The method 900 may include transmitting hot gas through the nozzle 300 onto the component to melt the plurality of solder joints. In one embodiment, the hot gas module 104 transmits hot gas through the nozzle 300. The hot gas may be transmitted in a direction along the axis 306 toward the proximal end 302 of the nozzle 300.

Figure 10:
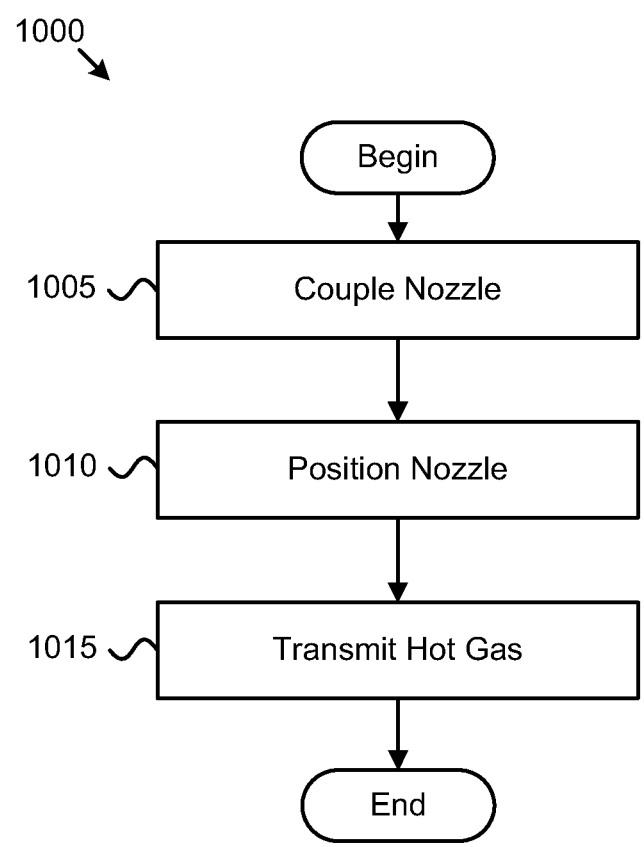
FIG. 10 is a schematic flow chart diagram illustrating one embodiment of a method for using a component rework nozzle in accordance with the present invention.

FIG. 10 is a schematic flow chart diagram illustrating one embodiment of a method 1000 for a using a component rework nozzle 300. The method 1000 refers to elements of FIGS. 1, 2, and 3A-D. The method 1000 begins and releasably couples 1005 a component rework nozzle 300 to a component rework station 100 by way of a coupling mechanism. In one embodiment, an operator releasably couples the component rework nozzle 3000 to the component rework station 100. The operator may include a worker, an automated mechanical and/or electrical process, a combination of a worker and an automated process, or the like. The nozzle 300, the coupling mechanism, and the component rework station 100 may be substantially similar to the like named elements described above in relation to FIGS. 3A-D, FIG. 8, and FIGS. 1-2 respectively. The method 1000 positions 1010 the nozzle 300 above the component 114 such that the nozzle 300 partially encloses the component 114. For example, the operator may position the nozzle 300 above the component. The method 1000 transmits 1015 hot gas through the nozzle 300 onto the component 114 to melt the plurality of solder joints. In one embodiment, the operator transmits the hot gas through the nozzle 300. The hot gas may be transmitted in a direction along the axis toward the proximal end of the nozzle 300. Then the method 1000 ends.

The embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
   a nozzle with a proximal end spaced apart from a distal end along an axis, the proximal end sized to partially enclose a component during a component rework process, the component disposed on a substrate by way of a plurality of solder joints;
   an indentation defined in a side of the nozzle, the side of the nozzle parallel to the axis, the indentation shaped to maintain a separation between the nozzle and a neighboring component, the neighboring component disposed adjacent to the component on the substrate, wherein the indentation exposes a portion of a top of the component such that the exposed portion of the top of the component is external to the nozzle; and
   a plurality of notches disposed on the proximal end of the nozzle, the plurality of notches formed to balance heat distribution, during the component rework process, across the component, wherein the plurality of notches are sized to balance the heat distribution by balancing gas flow across the component,
   wherein the nozzle comprises a void above the component wherein at top of the component is exposed to gas flow from the distal end of the nozzle.

2. The apparatus of claim 1, wherein the plurality of notches comprises an indentation notch disposed in the indentation on the proximal end of the nozzle, the indentation notch formed to accommodate an elevation of the exposed portion of the component and to allow gas flow across the top of the exposed portion of the component.

3. The apparatus of claim 2, wherein the plurality of notches comprises the indentation notch and one or more secondary notches, wherein an area of an opening of the indentation notch available for gas flow is approximately equal to half of a total area of openings of the secondary notches available for gas flow.

4. The apparatus of claim 1, wherein one or more of a size, a shape, and a position of each notch of the plurality of notches are formed to balance the heat distribution across portions of the component above the plurality of solder joints.

5. The apparatus of claim 1, wherein one or more of a size, a shape, and a position of each notch of the plurality of notches are based on a position of the neighboring component in relation to the component.

6. The apparatus of claim 1, wherein the plurality of notches are formed to balance heat distribution across the portions of the component above the plurality of solder joints.

7. The apparatus of claim 1, wherein the plurality of notches are formed to balance heat distribution by minimizing a temperature difference across the portions of the component above the plurality of solder joints.

8. The apparatus of claim 1, wherein the nozzle transmits hot gas in a direction along the axis toward the proximal end of the nozzle during the component rework process.

9. The apparatus of claim 1, wherein the nozzle comprises a plurality of sides parallel to the axis and wherein a first side and a second side join at a corner, wherein a particular notch is disposed at the corner on the proximal end of the nozzle.

10. The apparatus of claim 9, wherein the particular notch is disposed on a portion of the first side and a portion of the second side at the corner on the proximal end of the nozzle.

11. The apparatus of claim 1, wherein the indentation extends from the proximal end of the nozzle toward the distal end of the nozzle at least part way toward the distal end for a distance at least to a height above the neighboring component.

12. The apparatus of claim 1, further comprising a coupling mechanism attached to the distal end of the nozzle, the coupling mechanism configured to couple the nozzle to a component rework station.

13. A system comprising:
   a component rework station designed to secure a substrate and to transmit hot gas through an outlet in the component rework station;
   a coupling mechanism coupled to the component rework station;
   a nozzle attached to the coupling mechanism, the coupling mechanism coupling the nozzle to the component rework station at the outlet, the nozzle having a proximal end spaced apart from a distal end along an axis, the proximal end sized to partially enclose a component during a component rework process, the component disposed on the substrate by way of a plurality of solder joints;
   an indentation defined in a side of the nozzle, the side of the nozzle parallel to the axis, the indentation shaped to maintain a separation between the nozzle and a neighboring component, the neighboring component disposed adjacent to the component on the substrate, wherein the indentation exposes a portion of a top of the component such that the exposed portion of the top of the component is external to the nozzle; and
   a plurality of notches disposed on the proximal end of the nozzle, the plurality of notches formed to balance heat distribution, during the component rework process, across the component, wherein the plurality of notches are sized to balance the heat distribution by balancing gas flow across the component,
   wherein the nozzle comprises a void above the component wherein a top of the component is exposed to gas flow from the distal end of the nozzle.

14. The system of claim 13, further comprising a positioning module in the component rework station that positions the nozzle above the component during the component rework process such that the nozzle partially encloses the component during the component rework process.

15. The system of claim 13, further comprising a hot gas module that transmits hot gas through the nozzle in a direction along the axis toward the proximal end of the nozzle during the component rework process, the hot gas transmitted from the outlet of the component rework station.

16. A method comprising:
   forming a nozzle, the nozzle having a proximal end spaced apart from a distal end along an axis, the proximal end sized to partially enclose a component during a component rework process, the component disposed on a substrate by way of a plurality of solder joints;
   creating an indentation in a side of the nozzle, the side of the nozzle parallel to the axis, the indentation shaped to maintain a separation between the nozzle and a neighboring component, the neighboring component disposed adjacent to the component on the substrate, wherein the indentation exposes a portion of a top of the component such that the portion of the top of the component is external to the nozzle; and disposing a plurality of notches on the proximal end of the nozzle, the plurality of notches formed to balance heat distribution, during the component rework process, across the component, wherein the plurality of notches are sized to balance the heat distribution by balancing gas flow across the component, wherein the nozzle comprises a void above the component wherein at top of the component is exposed to gas flow from distal end of the nozzle.

17. The method of claim 16, further comprising positioning the nozzle above the component such that the nozzle partially encloses the component.

18. The method of claim 17, further comprising transmitting hot gas through the nozzle onto the component to melt the plurality of solder joints, the hot gas transmitted in a direction along the axis toward the proximal end of the nozzle.

19. An apparatus comprising:
- a nozzle with a proximal end spaced apart from a distal end along an axis, the proximal end sized to partially enclose a component during a component rework process, the component disposed on a substrate by way of a plurality of solder joints;
- a plurality of sides parallel to the axis, the plurality of sides extending between the proximal end and the distal end;
- an indentation defined in a side of the plurality of sides, the indentation shaped to maintain a separation between the nozzle and a neighboring component, the neighboring component disposed adjacent to the component on the substrate, the indentation exposing a portion of a top of the component such that the exposed portion of the top of the component is external to the nozzle; and
- a plurality of notches disposed on the proximal end of the nozzle, the plurality of notches formed to balance heat distribution, during the component rework process, across portions of the component above the plurality of solder joints, the plurality of notches comprising an indentation notch disposed in the indentation on the proximal end of the nozzle and one or more secondary notches on the proximal end of the nozzle, the indentation notch formed to accommodate an elevation of the exposed portion of the component, wherein the plurality of notches are sized to balance the heat distribution by balancing gas flow across the component, wherein the nozzle comprises a void above the component wherein a top of the component is exposed to gas flow from the distal end of the nozzle.

20. The apparatus of claim 1, wherein the plurality of notches comprises the indentation notch and one or more secondary notches, wherein an area of an opening of the indentation notch available for gas flow is approximately equal to a total area of openings of the secondary notches available for gas flow.

* * * * *